United States Patent [19]

Huijsing et al.

[11] Patent Number: 4,918,398
[45] Date of Patent: Apr. 17, 1990

[54] DIFFERENTIAL AMPLIFIER USING VOLTAGE LEVEL SHIFTING TO ACHIEVE RAIL-TO-RAIL INPUT CAPABILITY AT VERY LOW POWER SUPPLY VOLTAGE

[75] Inventors: Johan H. Huijsing, Schipluiden; Marien G. Maris, Delft, both of Netherlands

[73] Assignee: North American Philips Corporation, Signetics Division, Sunnyvale, Calif.

[21] Appl. No.: 309,469

[22] Filed: Feb. 10, 1989

[51] Int. Cl.[4] .............................................. H03F 3/45
[52] U.S. Cl. .................................. 330/252; 330/255; 330/258; 330/261
[58] Field of Search .............. 330/252, 253, 255, 257, 330/258, 261

[56] References Cited

U.S. PATENT DOCUMENTS

| | | | |
|---|---|---|---|
| 4,357,578 | 11/1982 | Yokoyama | 330/252 |
| 4,463,319 | 7/1984 | Kearney | 330/258 |
| 4,471,321 | 9/1984 | Bowers | 330/261 |
| 4,502,020 | 2/1985 | Nelson et al. | 330/265 |
| 4,532,479 | 7/1985 | Blauschild | 330/261 |
| 4,555,673 | 11/1985 | Huijsing et al. | 330/258 |
| 4,725,790 | 2/1988 | Addis et al. | 330/258 |
| 4,742,309 | 5/1988 | Chu | 330/258 |

FOREIGN PATENT DOCUMENTS 0288016 10/1988 European Pat. Off. .
2416533 10/1974 Fed. Rep. of Germany .

OTHER PUBLICATIONS

Huijsing et al., "Low Voltage-Operational Amplifier with Rail-to-Rail Input and Output Ranges", *IEEE Journal of Solid-State Circuits*, vol. SC-20, No. 6, Dec. 1985, pp. 1144-1150.

"Operationsverstärker" *Radio Fernshenen Elektronik*, Berlin 36, No. 7, 1987, pp. 469-470.

Primary Examiner—James B. Mullins
Attorney, Agent, or Firm—R. Meetin; A. Tamoshunas; T. Briody

[57] ABSTRACT

A differential amplifier coupled between sources of a high supply voltage ($V_{HH}$) and a low supply voltage ($V_{LL}$) contains a pair of differential portions (30 and 32) that are used to amplify a differential input signal ($V_{I1}$ and $V_{I2}$). One of the differential portions is turned on when the common-mode voltage of the input signal is in a portion of the supply range extending up to the high supply voltage. The other is turned on when the input common-mode voltage is in a portion of the supply range extending down to the low supply voltage. A level-shift circuit (38, 40, 42, 44, and 46) selectively raises or loweres the voltages at input points (P1, P2, P3, and P4) to the differential portions. The level shifts extend the conductive ranges of the differential portions. This enables the amplifier to achieve rail-to-rail input capability down to 1 volt or slightly less for the power supply voltage.

28 Claims, 12 Drawing Sheets

DIFFERENTIAL AMPLIFIER USING VOLTAGE LEVEL SHIFTING TO ACHIEVE RAIL-TO-RAIL INPUT CAPABILITY AT VERY LOW POWER SUPPLY VOLTAGE

FIELD OF USE

This invention relates to a differential amplifier suitable for use in an operational amplifier ("op amp") made in semiconductor integrated circuit form and, more specifically, to a differential amplifier that employs complementary differential portions to attain rail-to-rail input capability.

BACKGROUND ART

An integrated circuit often needs a low power supply voltage to avoid heat-dissipation problems. Low supply voltage will be even more necessary in the future as integrated circuits become increasingly more dense. It thus becomes desirable that a differential amplifier used as an input stage in an op amp have rail-to-rail input capability. That is, the output signal of the amplifier should be representative of the differential input signal as its common-mode voltage travels the full range of the power supply voltage. As used here to describe the relationship between two signals, "representative" means that their amplitudes have a substantially one-to-one (typically linear) relationship as long as the amplitudes are not too great.

Referring to the drawings, FIG. 1 illustrates a general arrangement for a prior art differential amplifier that can achieve rail-to-rail input capability at moderately low power supply voltage. See U.S. Pat. No. 4,555,673. Also see U.S. Pat. Nos. 4,463,319 and 4,532,479.

The amplifier in FIG. 1 employs a pair of complementary differential input portions 10 and 12 to amplify a circuit input signal differentially supplied between input terminals T1 and T2 as input voltages $V_{I1}$ and $V_{I2}$. Differential portion 10 consists of NPN transistors Q1 and Q2 whose bases receive the circuit input signal at input points P1 and P2 connected to terminals T1 and T2. The emitters of transistors Q1 and Q2 are connected together at a node $N_A$ to receive a first operating current $I_A$. Differential portion 12 is formed with PNP transistors Q3 and Q4 whose bases receive the circuit input signal at input points P3 and P4 connected to terminals T1 and T2. The emitters of transistors Q3 and Q4 are connected together at a node $N_B$ to receive a second operating current $I_B$. A main current supply 14 connected between sources for a high supply voltage $V_{HH}$ and a low supply voltage $V_{LL}$ provides currents $I_A$ and $I_B$ in opposite flow directions.

Portion 10 supplies amplified internal currents $I_{D1}$ and $I_{D2}$ from the Q1 and Q2 collectors. Portion 12 similarly provides amplified internal currents $I_{D3}$ and $I_{D4}$ from the Q3 and Q4 collectors. A summing circuit 16 connected between the $V_{HH}$ and $V_{LL}$ supplies suitably combines currents $I_{D1}$–$I_{D4}$ to generate a pair of complementary output currents $I_O$ and $\bar{I}_O$.

In looking at amplifier operation, it is convenient to define several terms. Let "$\Delta V$" and "$V_{CM}$" respectively represent the differential voltage $V_{I1}$-$V_{I2}$ and the common-mode voltage $(V_{I1} + V_{I2})/2$ of the circuit input signal. Let "$V_{PS}$" represent the power supply voltage $V_{HH} - V_{LL}$.

The prior art device in FIG. 1 can be characterized by a pair of threshold voltages $V_{TA}$ and $V_{TB}$ that may vary with $V_{PS}$. FIG. 2 shows a general example of how $V_{TA}$ and $V_{TB}$ may appear. FIG. 3 shows the resulting operational regions for the amplifier. The horizontal axis in FIG. 3 represents the condition where $V_{CM}$ equals $V_{LL}$. Line 18 (at 45°) represents the condition where $V_{CM}$ equals $V_{HH}$. The region between the horizontal axis and line 18 thereby encompasses the rail-to-rail operational range for the amplifier.

Input portion 10 is operatively conductive (turned on) when $V_{CM}$ is sufficiently high. More specifically:

$$V_{CM} - V_{LL} \geq V_{TA} \tag{1}$$

Eq. (1) basically corresponds to the portion of the $V_{PS}$ range between line 20A and line 18 in FIG. 3. The conductive region for portion 10 does, however, extend slightly above line 18 to a point where $V_{CM}$ is several tenths of a volt more than $V_{HH}$. When portion 10 is turned on, it amplifies the voltage difference between points P1 and P2 by splitting current $I_A$ between currents $I_{D1}$ and $I_{D2}$ at values whose difference is representative of $\Delta V$.

Input portion 12 is operatively conductive when $V_{CM}$ is sufficiently low. In particular:

$$V_{HH} - V_{CM} \geq V_{TB} \tag{2}$$

Eq. (2) basically corresponds to the portion of the $V_{PS}$ range between the horizontal axis and line 20B in FIG. 3. In addition, the conductive range for portion 10 extends slightly below the horizontal axis to a point where $V_{CM}$ is several tenths of a volt less than $V_{LL}$. hen portion 12 is turned on, it amplifies the voltage difference between points P3 and P4 by splitting current $I_B$ between currents $I_{D3}$ and $I_{D4}$ at values whose difference is representative of $\Delta V$.

FIG. 3 indicates that portion 10 is turned off in the space between the horizontal axis and line 20A—i.e., when $V_{CM} - V_{LL}$ is less than $V_{TA}$. Likewise, FIG. 3 shows portion 12 as being turned off in the area between lines 20B and 18. This corresponds to the condition in which $V_{HH} - V_{CM}$ is less than $V_{TB}$. In actuality, each of portions 10 and 12 usually switches between on and off over a spacing on the order of 100 millivolts. Lines 20A and 20B are thus idealizations of narrow voltage regions.

When $V_{PS}$ is reduced, the amount of $V_{CM}$ space available for the non-conductive regions for portions 10 and 12 decreases. The two non-conductive regions start to overlap when $V_{PS}$ reaches a level $V_{PSO}$. If $V_{PS}$ drops below $V_{PSO}$, $V_{CM}$ passes through a "dead zone" indicated by thick line 22 in which neither of portions 10 and 12 is operatively conductive. $V_{PSO}$ is thus the value of the minimum $V_{PS}$ level at which the differential amplifier in FIG. 1 can achieve rail-to-rail input capability.

Thresholds $V_{TA}$ and $V_{TB}$ have respective minimum values $V_{MA}$ and $V_{MB}$. See lines 24 and 26 in FIG. 3. In known embodiments of the amplifier in FIG. 1, $V_{PSO}$ is approximately equal to $V_{MA} + V_{MB}$.

The numerical value of $V_{PSO}$ depends on the base-emitter voltages of transistors Q1–Q4 and on the internal construction of current supply 14. FIGS. 4a and 4b depict two ways, both described in U.S. Pat. No. 4,555,673, for implementing supply 14. FIGS. 5a and 5b graphically show the specific idealized operational regions for the amplifier of FIG. 1 as implemented with the main current supplies shown respectively in FIGS. 4a and 4b.

Starting with the embodiment of FIG. 4a, supply 14 consists simply of a pair of current sources $S_L$ and $S_H$. Current source $S_L$ supplies current $I_A$ at a constant value $I_L$. Current source $S_H$ provides current $I_B$ at a constant value $I_H$. For current sources $S_L$ and $S_H$ to be conductive, the voltage across each of them must be at least equal to a minimum level $V_{SAT}$.

$V_{CM}$ exceeds the voltage at node $N_A$ by $1V_{BE}$ when portion 10 is turned on. $V_{BE}$ is the magnitude of the standard voltage across the base-emitter junction of a bipolar transistor when it is just turned on. The voltage at node $N_B$ similarly exceeds $V_{CM}$ by $1V_{BE}$ when portion 12 is turned on. In view of this, each of threshold minimums $V_{MA}$ and $V_{MB}$ equals $V_{BE} + V_{SAT}$. $V_{PSO}$ thereby equals $2V_{BE} + 2V_{SAT}$.

At a standard collector-emitter current of several microamperes, $V_{BE}$ is approximately 0.6 volt. $V_{SAT}$ can be as low as 0.1 volt. Using these values for $V_{BE}$ and $V_{SAT}$ (in the present computation and in all the additional ones below), $V_{PSO}$ is approximately 1.4 volts for the differential amplifier of FIGS. 1 and 4a.

A disadvantage of using the current supply in FIG. 4a is that the transconductance of the amplifier changes by a factor of approximately 2 whenever either of portions 10 and 12 turns on or off. The variation in transconductance makes it difficult to optimize the frequency compensation for the amplifier when it is used in an op am with negative feedback. The implementation shown in FIG. 4b overcomes this problem.

When the circuitry of FIG. 4b is used, supply 14 is formed with current source $S_H$, a PNP steering transistor QP whose base receives a reference voltage $V_{RP}$, and a current mirror 28 that supplies current $I_A$ at a value largely equal to the current $I_{QP}$ through transistor QP. Current steering through transistor QP enables the sum of $I_A$ and $I_B$ to approximately equal $I_H$. As a result, the transconductance is nearly constant as $V_{CM}$ varies across the entire $V_{PS}$ range.

The voltage across current mirror 28 between node $N_A$ and the $V_{LL}$ supply must be at least $1V_{SAT}$ for mirror 28 to be conductive. Under optimum conditions, the current steering causes lines 20A and 20B in FIG. 3 to merge into a single line 20 separated from line 18 by a vertical displacement equal to $V_{MB}$ as depicted in FIG. 5b. $V_{MA}$ equals $V_{BE} + V_{SAT}$ again. $V_{MB}$ may be as low as $V_{BE} + V_{SAT}$. Consequently, $V_{PSO}$ may again be equal to 1.4 volts.

As the above discussion indicates, the lowest tolerable value for $V_{PS}$ in the differential amplifier of FIG. 1 is approximately 1.4 volts. In practice, $V_{PS}$ may have to be a few tenths of a volt higher. While this is still relatively good, it would be quite useful to get down to 1.0 volt or less. For example, a single-cell battery having an unloaded rating of 1.5 volts typically drops down to about 1.0 volt under loaded conditions near the end of its life. The amplifier of FIG. 1 cannot operate efficiently from such a battery.

GENERAL DISCLOSURE OF THE INVENTION

The present invention is a differential amplifier that achieves rail-to-rail input capability at a very low power supply voltage. In bipolar embodiments, the power supply voltage can be at or slightly below 1.0 volt. This makes the invention particularly attractive for future low-voltage op amp applications. The invention can be powered from a single-cell 1.5-volt battery during the entire battery life.

More specifically, the present circuit centers around first and second differential portions that are used to amplify a circuit input signal differentially provided between first and second input terminals as first and second input voltages. The amplifier is coupled between a source of a high supply voltage and a source of a low supply voltage. The first differential portion is operatively conductive when the common-mode voltage of the circuit input signal is in a portion of the supply range extending up to the high supply voltage. The second differential portion is operatively conductive when the input common-mode voltage is in a portion of the supply range extending down to the low supply voltage.

When the first differential portion is turned on, it amplifies the voltage difference between first and second input points respectively coupled to the first and second input terminals to produce one or more amplified first internal signals. Similarly, when the second differential portion is turned on, it amplifies the voltage difference between third and fourth input points respectively coupled to the first and second terminals to produce one or more amplified second internal signals. A summing circuit combines the various internal signals to generate at least one circuit output signal.

Key to the invention is a level-shift circuit that selectively causes the voltages at the first and second points to be respectively higher than the first and second input voltages. The level-shift circuit also selectively causes the voltages at the third and fourth points to be respectively lower than the first and second input voltages. The voltage level shifts extend the conductive operational ranges of the differential portions so as to reduce the value of the minimum level of the power supply voltage at which the differential amplifier achieves rail-to-rail input capability.

One major part of the level-shift circuit is a network of level-shift elements that provide the level shifts. Normally, a first level-shift element is coupled between the first terminal and the first point. A second level-shift element is coupled between the second terminal and the second point. A third level-shift element is coupled between the first terminal and the third point. A fourth level-shift element is coupled between tee second terminal and a fourth point. Each level-shift element is preferably a resistor.

Another major part of the level-shift circuit is a current supply that provides current to the level-shift elements to control the values of the level shifts. This current supply usually consists of a group of current sources and a control circuit for controlling conduction of the current sources. The control circuit preferably operates in such a way as to gradually turn off the level-shift circuit as the power supply voltage rises to a point where level shifting is not needed.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 6:
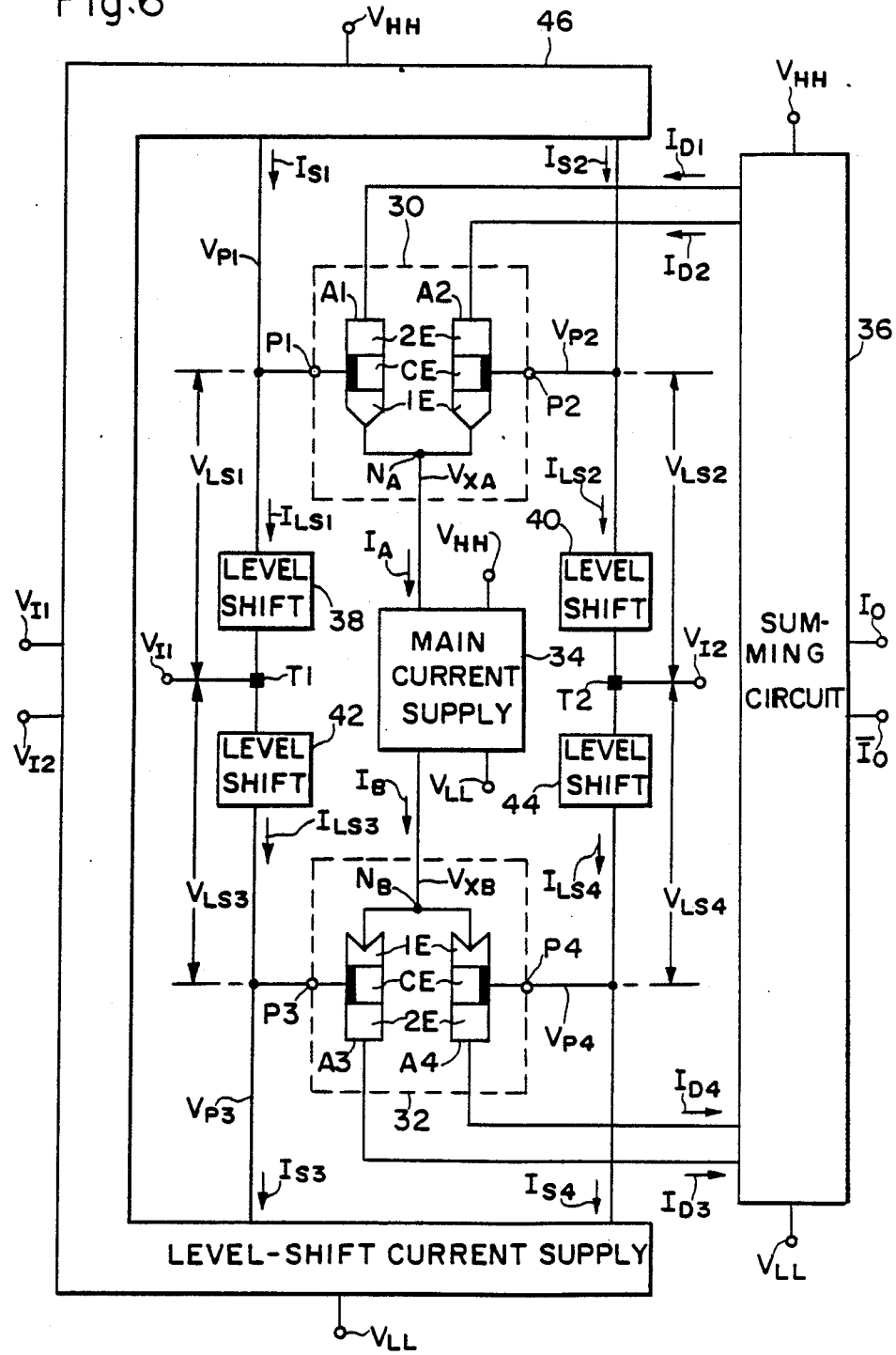
FIG. 6 is a block diagram of a general differential amplifier in accordance with the invention.

Referring to FIG. 6, it illustrates a general arrangement for a differential amplifier that amplifies a circuit input signal differentially supplied between input terminals T1 and T2 as input voltages $V_{I1}$ and $V_{I2}$. This differential amplifier uses a level-shifting technique in accordance with the invention to attain rail-to-rail capability for the common-mode voltage $V_{CM}$ of the circuit input signal at very low power supply voltage. The amplifier is particularly suitable for use as an input stage of a low-voltage op amp fabricated in semiconductor integrated circuit form.

The device in FIG. 6 centers around complementary differential input portions 30 and 32. Differential portion 30 consists of like-configured three-electrode input amplifiers A1 and A2. Differential portion 32 is formed with like-configured three-electrode input amplifiers A3 and A4 which are complementary to amplifiers A1 and A2. The term "complementary" means opposite polarity.

Amplifiers A1–A4 are referred to here as the "A" amplifiers. Each "A" amplifier has a first flow electrode (1E), a second flow electrode (2E), and a control electrode (CE) for controlling current flow between the flow electrodes (1E and 2E). Charge carriers, either electrons or holes, that move between the flow electrodes of each "A" amplifier originate a its first flow electrode and terminate at its second flow electrode. The current (if any) flowing in the control electrode is much smaller than that otherwise moving between the flow electrodes.

Each "A" amplifier preferably consists of a single transistor. In the case of a bipolar transistor, its emitter, collector, and base are respectively the first, second, and control electrodes. These elements are respectively the source, drain, and gate for a field-effect transistor of either the insulated-gate or junction type.

Although generally undesirable, each "A" amplifier could consist of more than one transistor. One example is a bipolar Darlington circuit in which the emitter of an input transistor is connected to the base of a trailing transistor. In this case, the control electrode of the "A" amplifier is (connected to) the base of the input transistor, while the first and second control electrodes are (connected to) the emitter and collector of the trailing transistor.

As used in describing amplifiers A1 and A2 or A3 and A4, "like-configured" means that the two amplifiers in question have corresponding elements interconnected in the same way and that each set of corresponding elements is of the same semiconductor polarity. For example, amplifiers A1 and A2 are like-configured if both are NPN transistors but not if one is an NPN transistor while the other is a PNP transistor. Likewise, Darlington circuits are like-configured as long as the input transistors are of the same polarity and the trailing transistors are of the same polarity (even if different from that of the input transistors).

Turning back to FIG. 6, the first electrodes of amplifiers A1 and A2 are connected together to receive operating current $I_A$ at node $N_A$. Similarly, amplifiers A3 and A4 have their first electrodes connected together to receive operating current $I_B$ at node $N_B$. A main current supply 34 connected between the $V_{HH}$ and $V_{LL}$ supplies provides oppositely directed currents $I_A$ and $I_B$. Current supply 34 may be implemented using either of the circuits shown in FIGS. 4a and 4b. Other embodiments described in U.S. Pat. No. 4,555,873 may also be used.

Differential portions 30 and 32 function in a complementary manner. When $V_{CM}$ is sufficiently high, portion 30 amplifies the voltage difference between input points P1 and P2 connected to the A1 and A2 control electrodes by dividing current $I_A$ into amplified internal currents $I_{D1}$ and $I_{D2}$ supplied from the A1 and A2 second electrodes. The difference between currents $I_{D1}$ and $I_{D2}$ is representative of the voltage difference between points P1 and P2. When $V_{CM}$ is sufficiently low, portion 32 amplifies the voltage difference between input points P3 and P4 connected to the A3 and A4 control electrodes by dividing current $I_B$ into amplified internal currents $I_{D3}$ and $I_{D4}$ supplied from the A3 and A4 second electrodes. The difference between currents $I_{D3}$ and $I_{D4}$ is representative of the voltage difference between points P3 and P4.

A summing circuit 36 connected between the $V_{HH}$ and $V_{LL}$ supplies suitably combines currents $I_{D1}$–$I_{D4}$ to produce complementary circuit output currents $I_O$ and $\bar{I}_O$. Summing circuit 36 may be implemented in any of the ways shown in U.S. Pat. Nos. 4,555,673 and 4,532,479. If desired, circuit 36 may provide only a single circuit output current.

A level-shift circuit consisting of a network of level-shift elements 38, 40, 42, and 44 and a level-shift supply circuit 46 selectively enables voltages $V_{P1}$ and $V_{P2}$ at points P1 and P2 to exceed voltages $V_{I1}$ and $V_{I2}$ by controllable level shifts $V_{LS1}$ and $V_{LS2}$ The level-shift circuit likewise selectively enables voltages $V_{P3}$ and $V_{P4}$ at points P3 and P4 to be less than voltages $V_{I1}$ and $V_{I2}$ by controllable level shifts $V_{LS3}$ and $V_{LS4}$. Level-shift elements 38-44, which are connected between terminals T1 and T2 and points P1-∝ in the manner shown in FIG. 6, directly provide level-shift voltages $V_{LS1}$-$V_{LS4}$.

Level-shift current supply 46, which is connected between the $V_{HH}$ and $V_{LL}$ supplies controls the operation of level shifts 38-44. Current supply 46 accomplishes the control by providing supply currents $I_{S1}$, $I_{S2}$, $I_{S3}$, and $I_{S4}$ along lines connected to points P1-P4. Although not indicated in FIG. 6, supply 46 is typically connected to other points in the amplifier circuit. For example, supply 46 may provide current at terminals T1 and T2 in some embodiments of the invention.

As indicated in FIG. 6, level-shift currents $I_{LS1}$, $I_{LS2}$, $I_{LS3}$, and $I_{LS4}$ actually flow through elements 38-44. Currents $I_{LS1}$-$I_{LS4}$ respectively differ from currents $I_{S1}$-$I_{S4}$ by the currents (if any) flowing through the respective control electrodes of amplifiers A1-A4. The control-electrode current normally can be neglected. As a result, each level-shift current $I_{LSi}$ is substantially equal to corresponding supply current $I_{Si}$ (where i is 1, 2, 3, or 4).

To have a good common-mode rejection ratio, $V_{LS1}$ and $V_{LS2}$ are preferably equal. Consequently, $I_{LS1}$ and $I_{LS2}$ are preferably equal. Likewise, $V_{LS3}$ and $V_{LS4}$ are preferably equal so that $I_{LS3}$ and $I_{LS4}$ are also preferably equal.

It is desirable to avoid loading the circuitry that supplies circuit inputs $V_{I1}$ and $V_{I2}$. Except for the situation in which other internal current of significant magnitude is supplied at terminals T1 and T2, this objective can usually be reached by setting $I_{LS3}$ equal to $I_{LS1}$. Likewise, $I_{LS4}$ is usually chosen to equal $I_{LS2}$. The result is that currents $I_{LS1}$-$I_{LS4}$ are typically all equal. Nonetheless, voltages $V_{LS3}$ and $V_{LS4}$ may still respectively differ from voltages $V_{LS1}$ and $V_{LS2}$.

Current supply 46 utilizes currents $I_{S1}$-$I_{S4}$ to control the values of voltages $V_{LS1}$-$V_{LS4}$ in a way that reduces the minimum rail-to-rail $V_{CM}$ level for the power supply voltage to a value lower than that which would be needed if (a) $V_{P1}$ and $V_{P3}$ always equalled $V_{I1}$ and (b) $V_{P2}$ and $V_{P4}$ always equalled $V_{I2}$. An understanding of how the level-shift control is accomplished can be facilitated by first considering what would happen if components 38-46 were absent. In that case, the operation would proceed basically in the manner described above for the differential amplifier of FIG. 1. When power supply voltage $V_{PS}$ drops below prior art value $V_{PSO}$, $V_{CM}$ would pass through (at least part of) the dead zone in which neither of portions 30 and 32 is operatively conductive.

Figure 2:
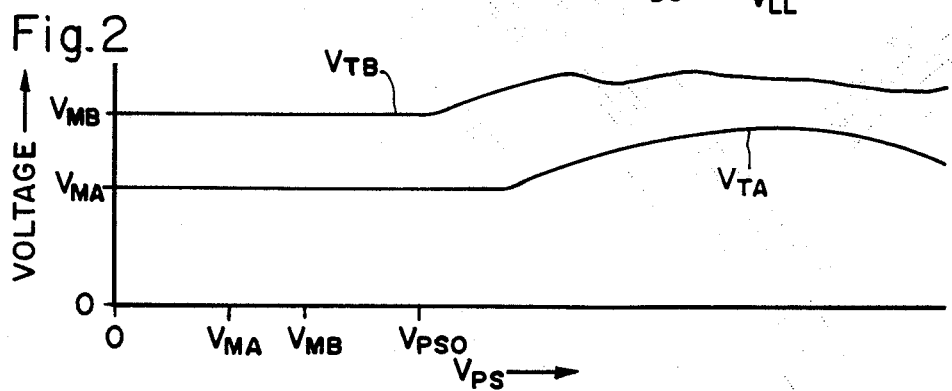
FIGS. 2 and 3 are graphs depicting operational features for the amplifier of FIG. 1.

With the level-shift circuit present, the operation can still be described in terms of thresholds $V_{TA}$ and $V_{TB}$ shown in FIG. 2. However, $V_{CM}$ in Eq. 1 must be replaced with the common-mode voltage $V_{CMA}$ at points P1 and P2. Differential portion 30 is turned on when:

$$V_{CMA} - V_{LL} \geq V_{TA} \quad (3)$$

In view of Eq. (3), $V_{LS1}$ and $V_{LS2}$ must be related to $V_{TA}$ as follows in order to make portion 30 operatively conductive if $V_{CM}$ is not high enough in itself to turn portion 30 on:

$$V_{LS1}, V_{LS2} \geq V_{TA} - V_{CM} - V_{LL} \quad (4)$$

Because supply 46 operates from the $V_{HH}$ supply, Eq. (4) is at least subject to the limitation that:

$$V_{LS1}, V_{LS2} < V_{HH} - V_{CM} \quad (5)$$

$V_{CM}$ in Eq. (2) must similarly be replaced with the common-mode voltage $V_{CMB}$ at points P3 and P4. Portion 32 is turned on when:

$$V_{HH} - V_{CMB} \geq V_{TB} \quad (6)$$

Accordingly, $V_{LS3}$ and $V_{LS4}$ must satisfy the following relationship with $V_{TB}$ so as to make portion 32 operatively conductive if $V_{CM}$ itself is not low enough to turn portion 32 on:

$$V_{LS3}, V_{LS4} \geq V_{TB} + V_{CM} - V_{HH} \quad (7)$$

Since supply 46 also operates from the $V_{LL}$ supply, Eq. (7) is at least subject to the restriction that:

$$V_{LS3}, V_{LS4} \geq V_{CM} - V_{LL} \quad (8)$$

A level shift is usually not needed when $V_{PS}$ is greater than $V_{PSO}$ (since $V_{CM}$ will be sufficient in itself to cause one or both of portions 30 and 32 to turn on). When $V_{PS}$ is less than $V_{PSO}$ so that a level shift is needed, thresholds $V_{TA}$ and $V_{TB}$ are preferably at their respective minimum values $V_{MA}$ and $V_{MB}$. As a result, $V_{MA}$ and $V_{MB}$ can be respectively substituted for $V_{TA}$ and $V_{TB}$ in Eq. (4) and (7).

Let $V_{SATH}$ be the minimum voltage spacing that supply 46 allows between $V_{HH}$ and the highest of $V_{P1}$ and $V_{P2}$. Likewise, let $V_{SATL}$ be the minimum voltage spacing that supply 46 permits between $V_{LL}$ and the lowest of $V_{P3}$ and $V_{P4}$. When $V_{CM}$ is not adequate by itself to cause at least one of portions 30 and 32 to become conductive, supply 46 thereby normally provides currents $I_{S1}$-$I_{S4}$ at values that enable level shifts $V_{LS1}$-$V_{LS4}$ to satisfy the following relationships:

$$V_{HH} - V_{CM} - V_{SATH} \geq V_{LS1},$$
$$V_{LS2} \geq V_{MA} - V_{CM} + V_{LL} \quad (9)$$

$$V_{CM} - V_{LL} - V_{SATL} \geq V_{LS3},$$
$$V_{LS4} \geq V_{MB} + V_{CM} - V_{HH} \quad (10)$$

Figure 3:
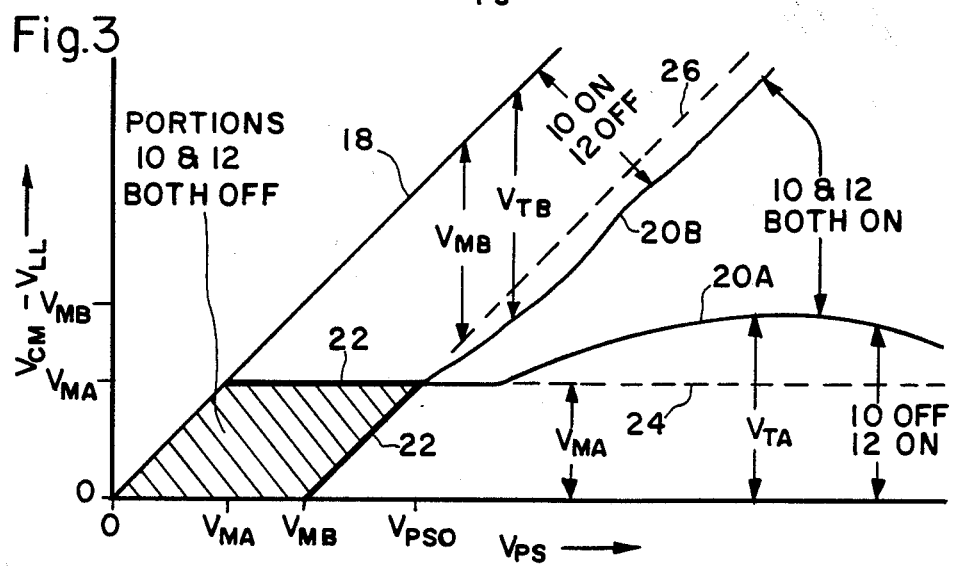
Figure 7A:
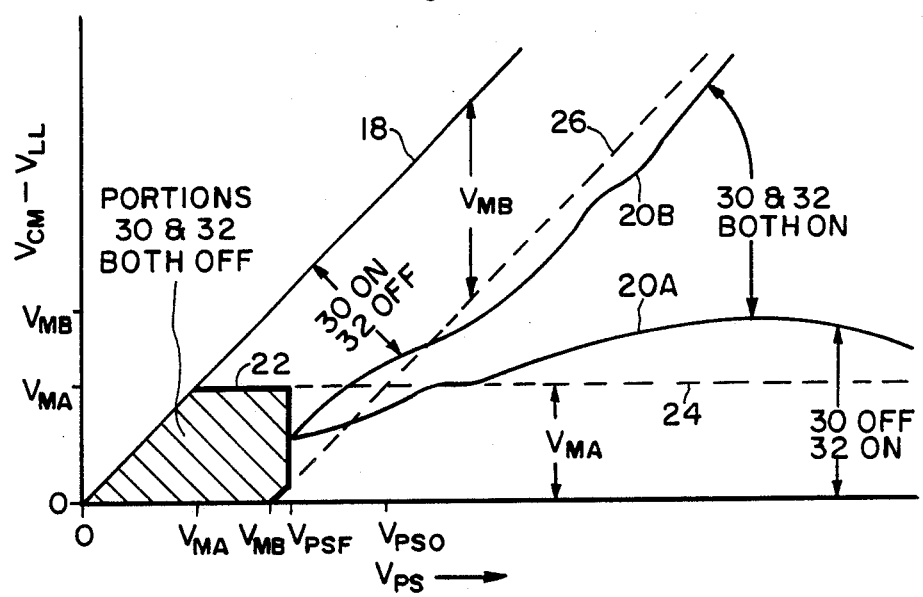
FIGS. 7a and 7b are graphs generally illustrating the operational regions for the amplifier of FIG. 6.
Figure 7B:
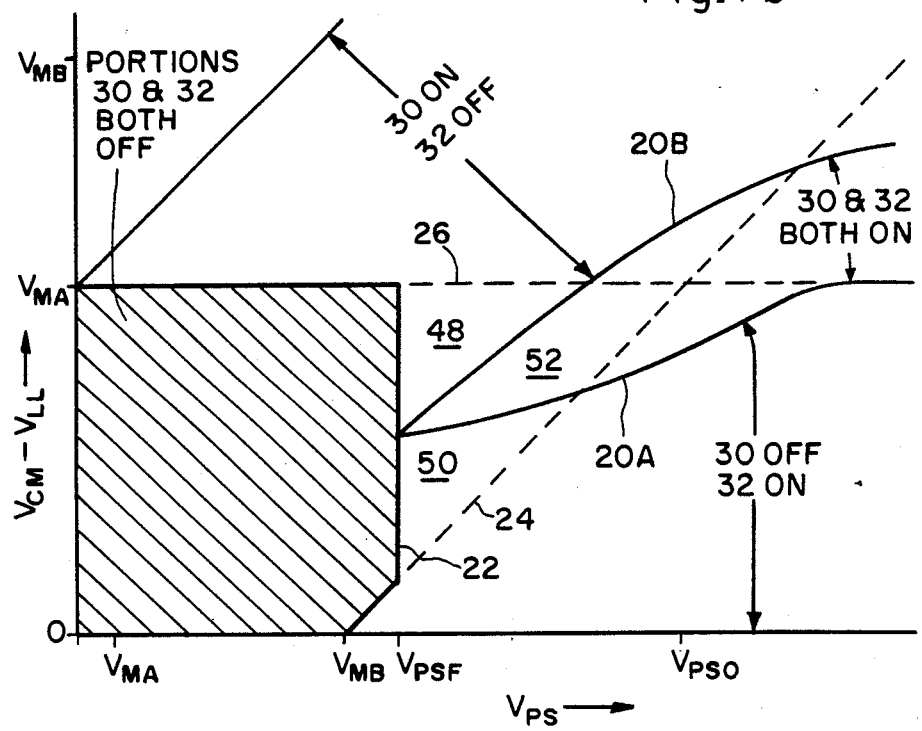

For the situation in which $V_{TA}$ and $V_{TB}$ vary in the manner indicated in FIG. 2, FIGS. 7a and 7b show the operational regions that result from using the level-shift circuit. FIG. 7b is a 3X magnification of a lower portion of FIG. 7a encompassing the $V_{MA}$-to-$V_{PSO}$ part of the $V_{PS}$ range. Lines 18, 24, and 26 are the $V_{HH}$, $V_{MA}$, and $V_{MB}$ lines as in FIG. 3. Lines 20A, 20B, and 22 of FIG. 7a have the same meaning for the invention that lines 20A, 20B, and 22 have in FIG. 3 for the prior art circuit of FIG. 1.

The point where the non-conductive region for portion 30 starts to overlap with the non-conductive region for portion 32 occurs when $V_{PS}$ is at a value $V_{PSF}$ as indicated in FIG. 7a. This is the lowest value of the power supply voltage at which the differential amplifier of FIG. 6 can achieve rail-to-rail input capability. Due to the level shift, $V_{PSF}$ is less than $V_{PSO}$. For the usual case in which $V_{PSO}$ equals $V_{MA} + V_{MB}$, $V_{PSF}$ is thus less than $V_{MA} + V_{MB}$.

The lower limit for $V_{PSF}$ is slightly greater than the larger of $V_{MA}$ and $V_{MB}$ in the normal situation. More specifically, $V_{PSF}$ usually equals (a) $V_{MA} + V_{SATH}$ or (b) $V_{MB} + V_{SATL}$, whichever is larger.

Turning briefly to FIG. 7b, the three different zones of the triangular operational region formed by lines 22, 24, and 26 are labeled with reference numbers 48, 50, and 52. If $V_{CM}$ is in zone 48, the level-shift circuit preferably adjusts $V_{LS1}$ and $V_{LS2}$ according to Eq. (9) so as to turn portion 30 on. If $V_{CM}$ is in zone 50, the level-shift circuit preferably adjusts $V_{LS3}$ and $V_{LS4}$ according to Eq. (10) in order to turn portion 32 on. Finally, the level-shift circuit adjusts $V_{LS1}$–$V_{LS4}$ according to Eqs. (9) and (10) so as to turn on both of portions 30 and 32 when $V_{CM}$ is in zone 52.

Figure 8:
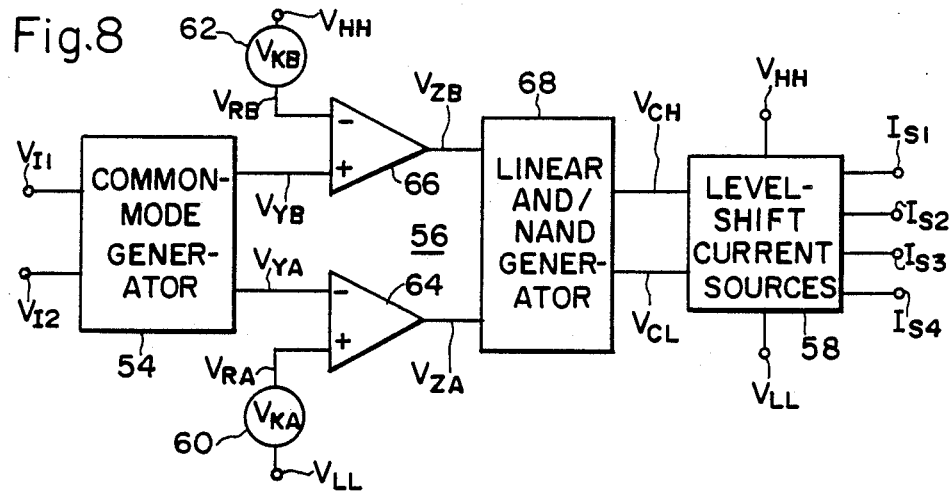
FIG. 8 is a block diagram of an embodiment of the level-shift current supply in FIG. 6.

FIG. 8 illustrates a general functional embodiment for current supply 46 in FIG. 6. In this embodiment, a common-mode generator 54 responsive to circuit inputs $V_{I1}$ and $V_{I2}$ produces operating voltages $V_{YA}$ and $V_{YB}$ that bear specific relationships to $V_{CM}$. For example, each of voltages $V_{YA}$ and $V_{YB}$ may differ from $V_{CM}$ by an amount that is largely constant at a given temperature. In response to signals $V_{YA}$ and $V_{YB}$, a level-shift current control circuit 56 generates a pair of control voltages $V_{CL}$ and $V_{CH}$ that control the operation of a set of level-shift current sources 58 suitably connected between the $V_{LL}$ and $V_{HH}$ supplies. Sources 58 provide supply currents $I_{S1}$–$I_{S4}$.

Turning back to current control 56, it consists of voltage reference sources 60 and 62, differential amplifiers 64 and 66, and a linear AND/NAND generator 68. Reference sources 60 and 62 provide reference voltages $V_{RA}$ and $V_{RB}$ at values respectively "referenced" to low supply voltage $V_{LL}$ and high supply voltage $V_{HH}$. In particular, $V_{RA}$ typically exceeds $V_{LL}$ by an amount $V_{KA}$ that is largely constant at a given temperature. $V_{RB}$ is likewise lower than $V_{HH}$ by an amount $V_{KB}$ that is largely constant at a given temperature.

Figure 9A:
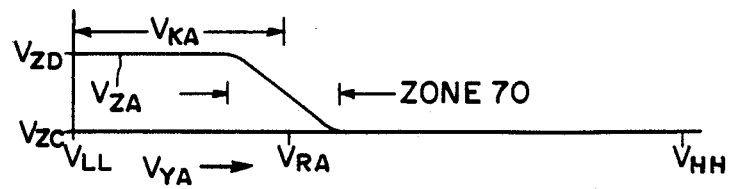
FIGS. 9a, 9b, and 10 are graphs generally showing operational parameters for the amplifier of FIG. 6 as embodied with the circuitry of FIG. 8.
Figure 9B:
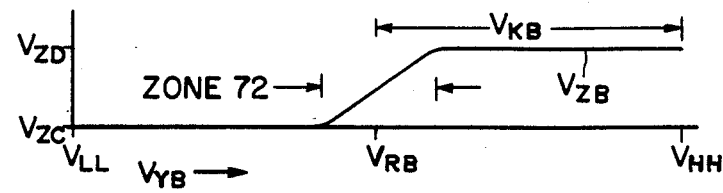

Amplifier 64 amplifies the difference between voltages $V_{YA}$ and $V_{RA}$ to produce an amplified voltage $V_{ZA}$ that gradually changes from high level $V_{ZD}$ to low level $V_{ZC}$ as $V_{YA}$ passes $V_{RA}$. Amplifier 66 amplifies the difference between voltages $V_{YB}$ and $V_{RB}$ to produce an amplified voltage $V_{ZB}$ that gradually changes from $V_{ZC}$ to $V_{ZD}$ as $V_{YB}$ passes $V_{RB}$. FIGS. 9a and 9b respectively show how voltages $V_{ZA}$ and $V_{ZB}$ basically vary. Transition zones 70 and 72 in FIGS. 9a and 9b are typically 100 millivolts in width.

Figure 10:
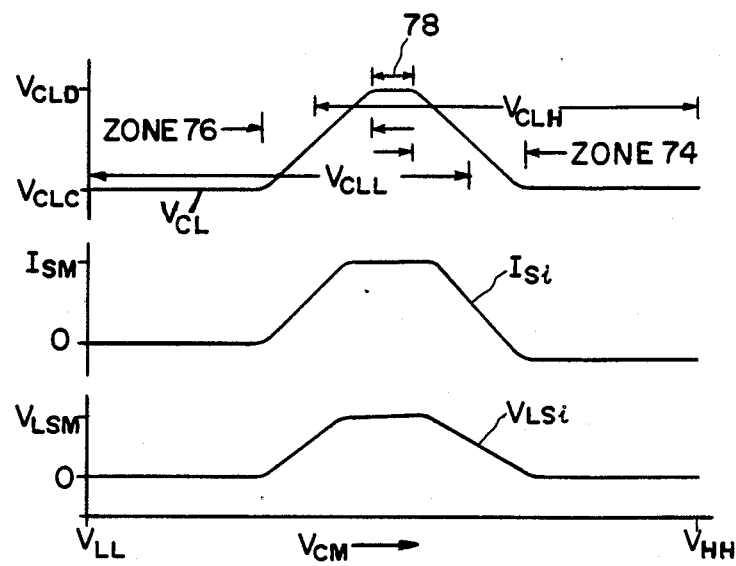

Generator 68 supplies (a) control voltage $V_{CL}$ as the linear AND of voltages $V_{ZA}$ and $V_{ZB}$ and (b) control voltage $V_{CH}$ as the linear NAND of voltages $V_{ZA}$ and $V_{ZB}$. Referring to FIG. 10, the top curve depicts how voltage $V_{CL}$ varies between low level $V_{CLC}$ and high level $V_{CLD}$ as a function of $V_{CM}$.

Transition zones 70 and 72 for $V_{ZA}$ and $V_{ZB}$ are reflected in $V_{CL}$ as respective transition zones 74 and 76. The centers of zones 74 and 76 are respectively "referenced" to $V_{LL}$ and $V_{HH}$. That is, the center of zone 74 is separated from $V_{LL}$ by a voltage spacing $V_{CLL}$ that is largely constant at a given temperature. The center of zone 76 is similarly separated from $V_{HH}$ by a voltage spacing $V_{CLH}$ that is largely constant at a given temperature. As a consequence, the separation between zones 74 and 76 varies inversely with $V_{PS}$.

FIG. 10 indicates that the $V_{CL}$ curve has a flat portion 78 situated between zones 74 and 76. It is usually preferable that zones 74 and 76 meet so that portion 78 compresses to a point. If zones 74 and 76 do so meet, an increase in $V_{PS}$ causes zones 74 and 76 to merge into each other. High level $V_{CLD}$ decreases in value.

FIG. 10 also shows how typical supply current $I_{Si}$ and typical level shift $V_{LSi}$ vary when control voltage $V_{CL}$ (or $V_{CH}$) has the indicated variation. Zones 74 and 76 are reflected directly in the $I_{Si}$ and $V_{LSi}$ curves. If a sufficient increase in $V_{PS}$ causes zones 74 and 76 to merge, high levels $I_{SM}$ and $V_{LSM}$ for the $I_{Si}$ and $V_{LSi}$ curves usually decrease. In this way, the level-shift circuit gradually shuts off as $V_{PS}$ rises.

Figure 1:
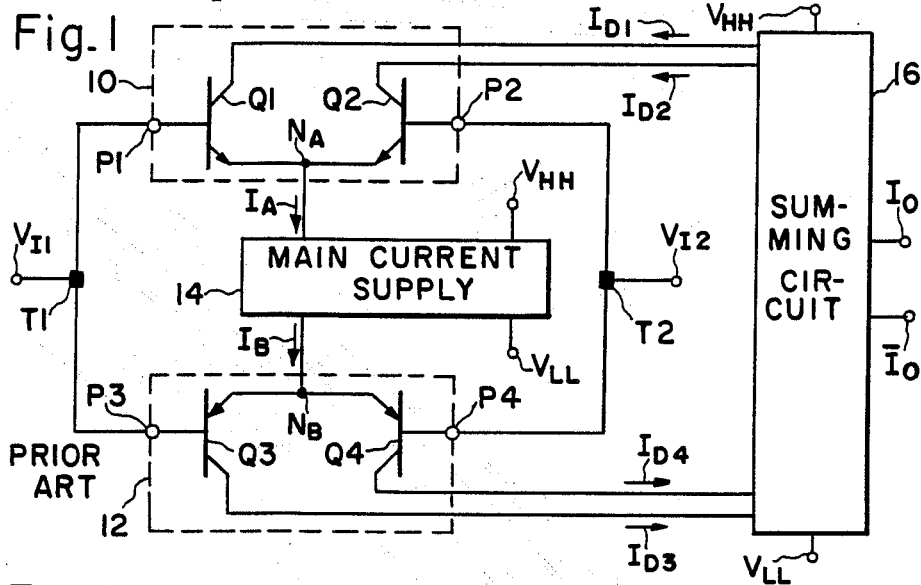
FIG. 1 is a block and circuit diagram of a prior art differential amplifier.
Figure 11:
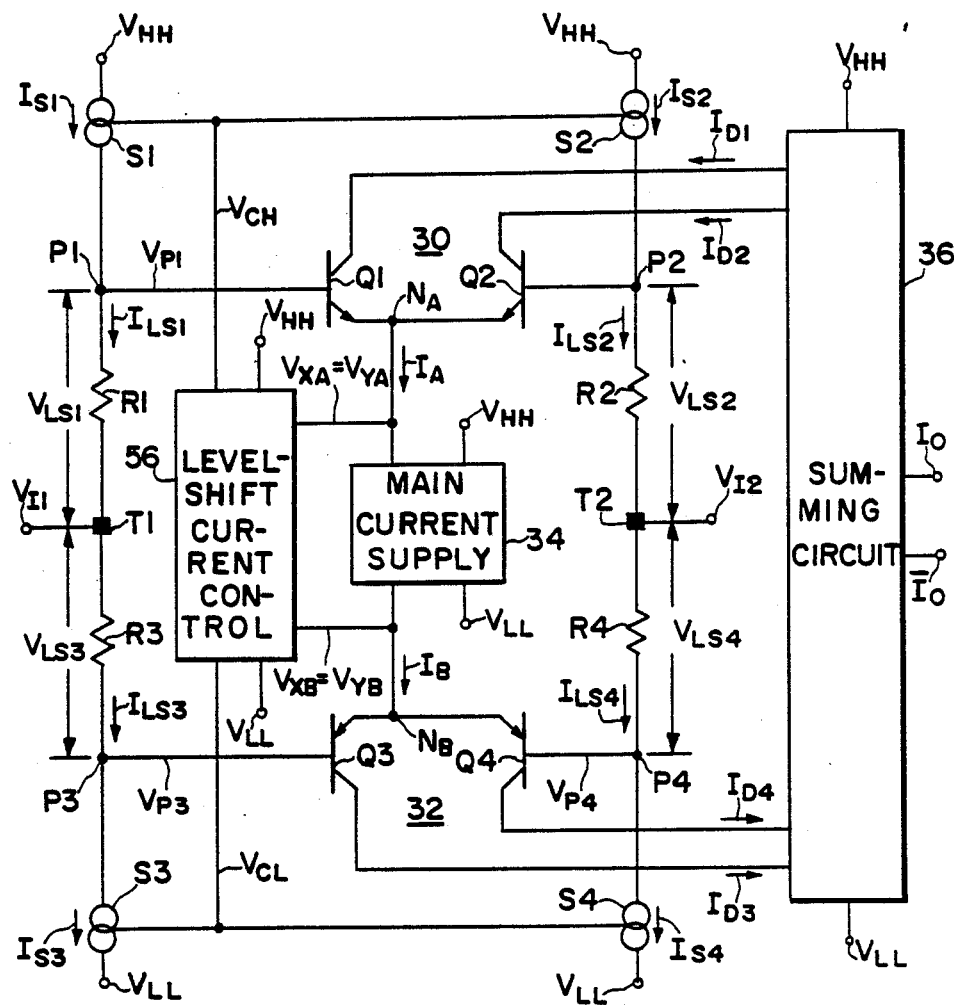
FIG. 11 is a block and circuit diagram of a general embodiment of the amplifier of FIG. 6.

Moving to FIG. 11, it shows an embodiment of FIG. 6 in which amplifiers A1–A4 are formed with bipolar transistors Q1–Q4 arranged the same as in FIG. 1. Level shifts 38–44 are embodied with resistors R1, R2, R3, and R4 in FIG. 11. Common-mode generator 54 of FIG. 8 is implemented with components 30, 32, 34, and R1–R4 in FIG. 11. These components in combination with current supply 56 form a level-shift feedback control loop. Finally, current sources 58 of FIG. 8 are implemented with variable current sources S1, S2, S3, and S4 in FIG. 11. Signal $V_{CH}$ controls current sources S1 and S2, while signal $V_{CL}$ controls current sources S3 and S4.

Figure 4A:
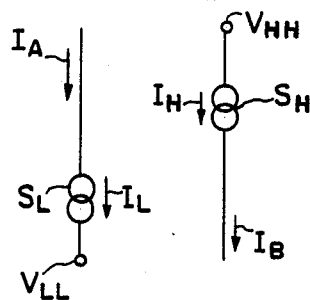
FIGS. 4a and 4b are circuit diagrams of prior art embodiments of the main current supply in FIG. 1.
Figure 4B:
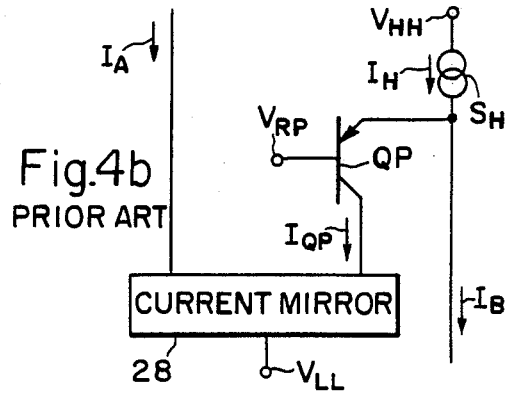
Figure 5A:
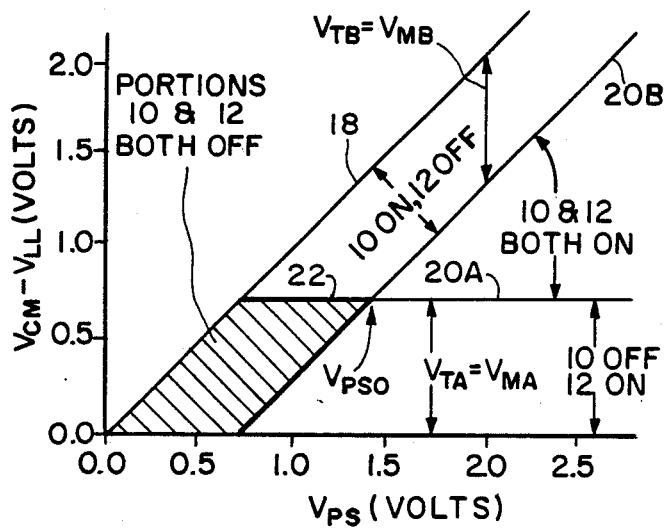
FIGS. 5a and 5b are graphs showing the primary operational regions for the amplifier of FIG. 1 as respectively embodied with the current supplies of FIGS. 4a and 4b.
Figure 5B:
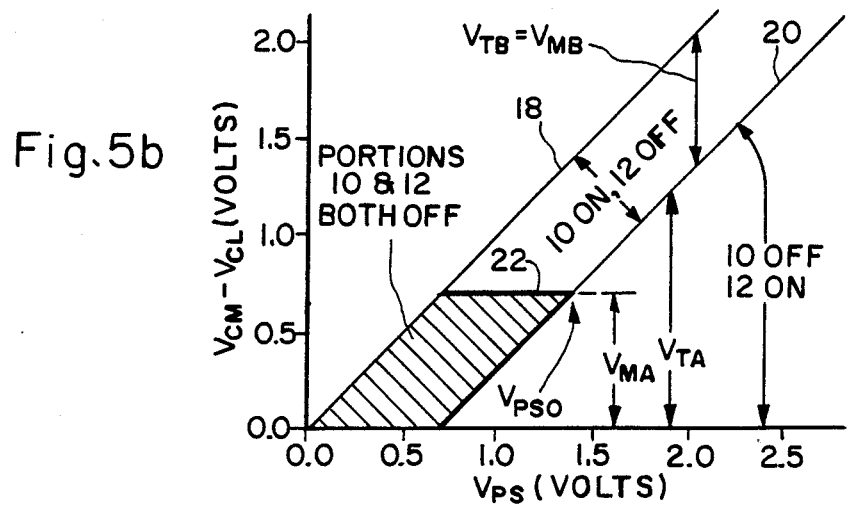

In FIG. 11, $V_{MA}$ equals $V_{BE} + V_{SAT}$ when main supply 34 is implemented with the circuitry of FIG. 4a or 4b. For the optimum case in which $V_{RP}$ equals $V_{HH}$–$V_{MB}$ in FIG. 4b, the same applies to $V_{MB}$. The minimum voltage across each of current sources S1–S4 when they are fully conductive is $1V_{SAT}$. Since each spacing $V_{SATL}$ or $V_{SATH}$ thereby equals $1V_{SAT}$, $V_{PSF}$ equals $V_{BE} + 2V_{SAT}$. Using the above values of 0.6 volt for $V_{BE}$ and 0.1 volt for $V_{SAT}$, $V_{PSF}$ is approximately 0.8 volt.

Figure 12:
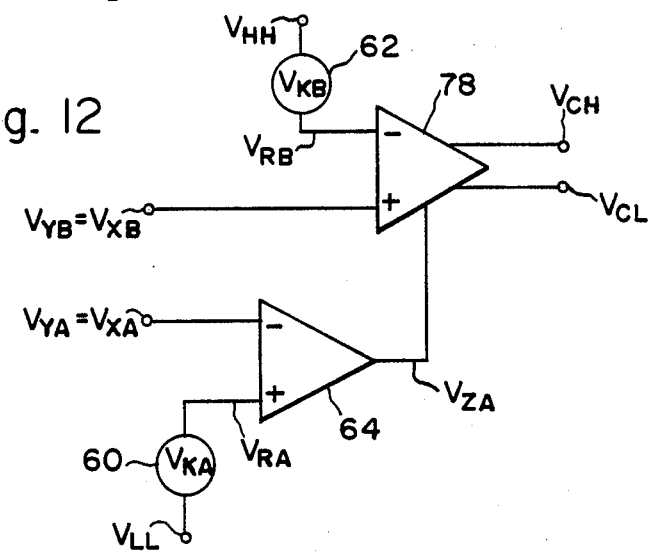
FIG. 12 is a block diagram of an embodiment of the level-shift current control in FIG. 11.

FIG. 12 depicts a preferred way for implementing current control 56 in FIG. 11. The circuitry in FIG. 12 differs from current control 56 in FIG. 8 in that the circuit of FIG. 12 employs a differential amplifier 78 to perform the functions of components 60 and 68 in FIG. 8. Amplifier 78 amplifies the difference between voltages $V_{YB}$ and $V_{RB}$ just as amplifier 66 does in FIG. 8. However, amplifier 78 has a gain control terminal that receives voltage $V_{ZA}$ from amplifier 64. This allows amplifier 78 to produce control voltages $V_{CL}$ and $V_{CH}$ in much the same way as shown in FIG. 10.

Figure 13A:
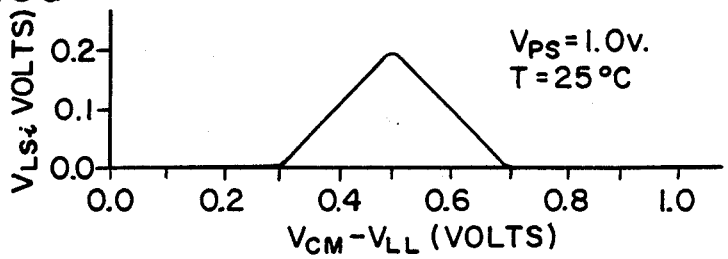
FIGS. 13a, 13b, and 13c are graphs illustrating how level-shift voltage preferably varies as a function of input common-mode voltage for the amplifier of FIG. 11.
Figure 13B:
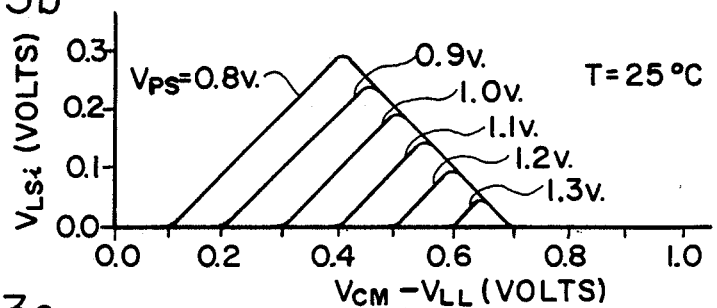
Figure 13C:
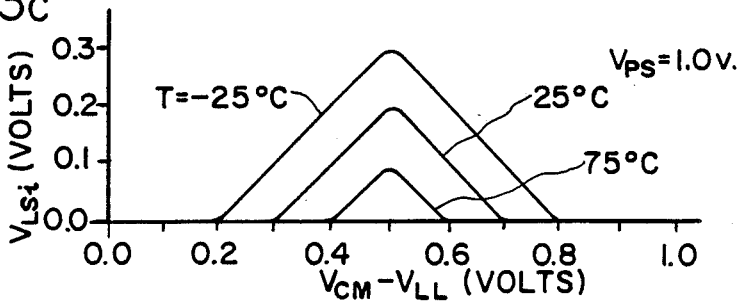

FIGS. 13a–13c indicate the manner in which level-shift voltage $V_{LSi}$ preferably varies as a function of $V_{CM}$ for the differential amplifier of FIG. 11 when implemented with current control 56 of FIG. 8 or 12. For the case illustrated in FIGS. 13a–13c, resistors R1–R4 all have the same resistance. FIG. 13a depicts the basic situation at standard temperature and 1.0-volt $V_{PS}$. FIG. 13b illustrates how the level-shift circuit gradually "turns off" as $V_{PS}$ increases. No level shifting is needed when $V_{PS}$ is at or above 1.4 volts. As indicated in FIG. 13c, the level-shift circuit also automatically increases $V_{LSi}$ with decreasing temperature, and vice versa, to provide temperature compensation.

Figure 14A:
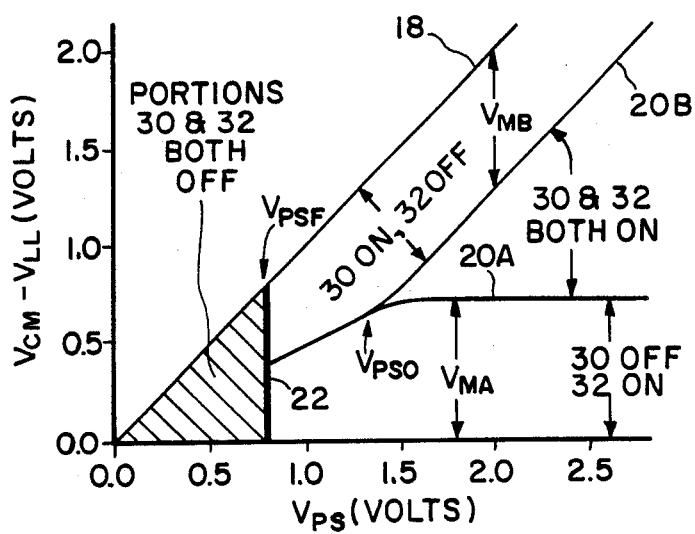
FIGS. 14a and 14b are graphs showing the operational regions for the amplifier of FIG. 11 as respectively embodied with the currents supplies of FIGS. 4a and 4b.
Figure 14B:
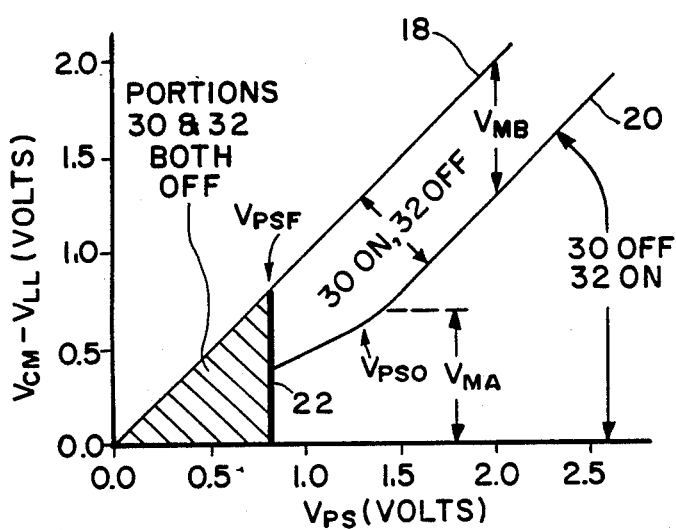

FIGS. 14a and 14b graphically show the idealized operational regions that arise for the differential amplifier of FIG. 11 when main current supply 34 is respectively embodied with the circuitry of FIGS. 4a and 4b. In FIG. 14a, the merged portion of lines 20A and 20B lying between $V_{PSO}$ and $V_{PSF}$ is equally separated from $V_{LL}$ and $V_{HH}$. The same applies to the portion of line 20 located between $V_{PFO}$ and $V_{PSF}$ in FIG. 14b.

Figure 15:
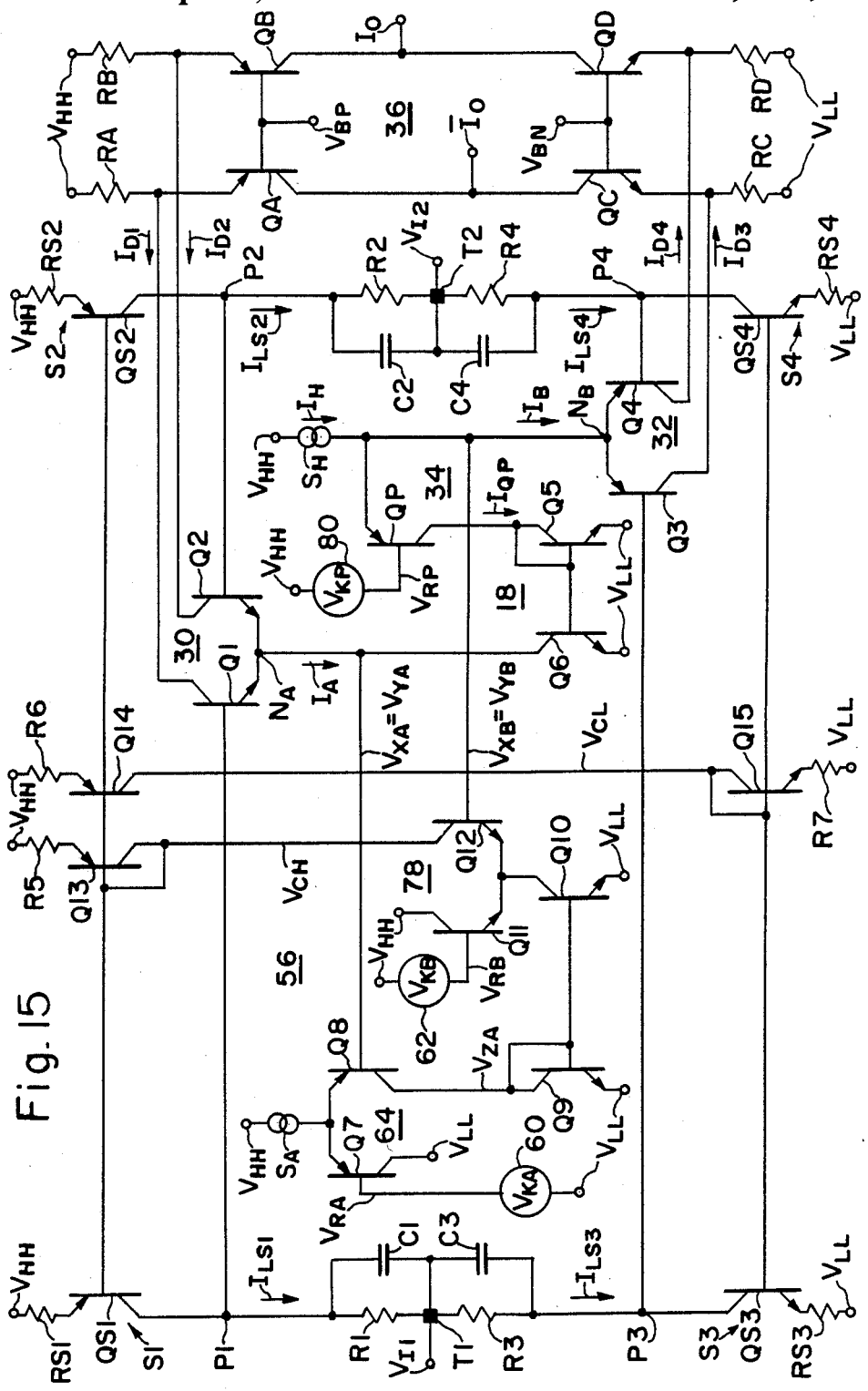
FIG. 15 is a circuit diagram of a preferred bipolar embodiment of the amplifier of FIG. 11.

A preferred bipolar embodiment for the present differential amplifier is shown in FIG. 15. Subject to the following comments, the elements used in FIG. 15 to implement the components of the amplifier of FIG. 11 can be determined by inspection. Main supply 34 is implemented with the circuit of FIG. 4b. Consequently, the transconductance of the amplifier in FIG. 15 is largely constant. A voltage reference source 80 supplies reference voltage $V_{RP}$ at a value lower than voltage $V_{HH}$ by an amount $V_{KP}$ that is largely constant at a given temperature. For supply 34 to operate optimally, $V_{KP}$ equals $V_{BE} + V_{SAT}$. That is, $V_{RP}$ equals $V_{HH} - V_{BE} - V_{SAT}$.

Current control 56 in FIG. 15 use the arrangement shown in FIG. 12. Based on what has been said above about FIG. 12, a detailed understanding of the various circuit elements in control 56 should be evident to a skilled artisan. Resistors R1-R4 introduce an extra frequency pole. Capacitors C1, C2, C3 and C4 provide frequency compensation by introducing a frequency zero at approximately the same location as the extra pole.

Figure 16:
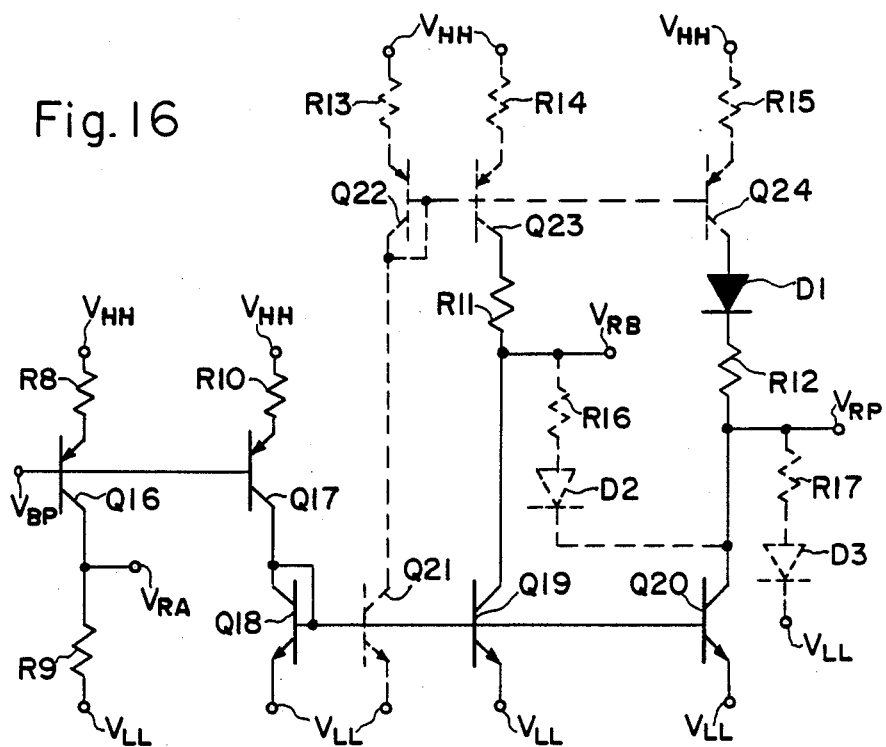
FIG. 16 is a circuit diagram of a preferred embodiment of the reference voltage circuitry in FIG. 15.
Figure 17:
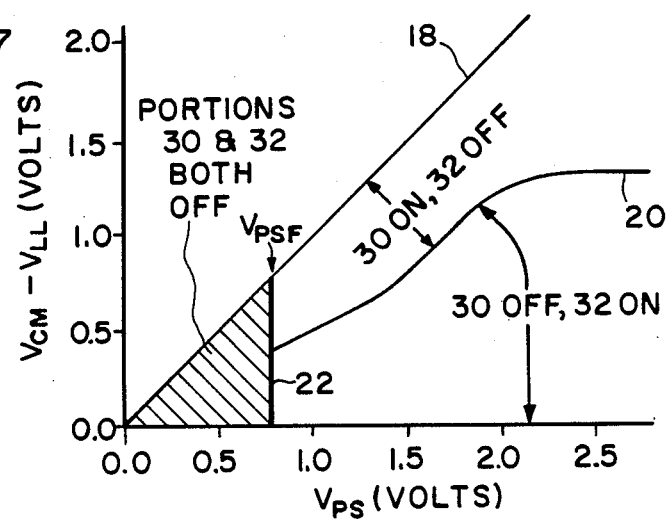
FIG. 17 is a graph illustrating the operational regions for the amplifier of FIG. 15 as embodied with the complete reference voltage circuitry in FIG. 16.

FIG. 16 illustrates two ways for implementing voltage reference sources 60, 62, and 80. Using only the circuit elements shown in solid line, $V_{RB}$ and $V_{RP}$ are separated from $V_{HH}$ by relatively constant amounts at a given temperature. However, it is usually desirable to employ portion 30 over more of the $V_{PS}$ range than portion 32 because NPN transistors require less base current than PNP transistors. This objective can be reached by using the entire circuitry (both solid line and dashed line) shown in FIG. 16. The full circuitry in FIG. 16 also avoid Zener problems that NPN components 30 and 78 might otherwise encounter. In this case, FIG. 17 illustrates the resulting idealized operational regions. The level-shift circuit shuts off when $V_{PS}$ goes above 1.6 volts.

Figure 18A:
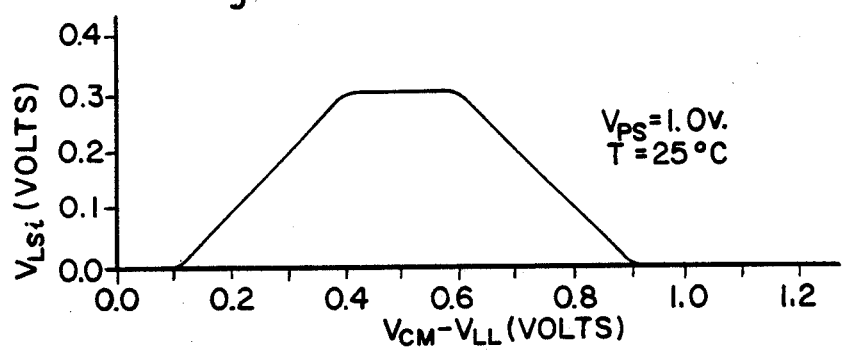
FIGS. 18a and 18b are graphs showing an alternative variation for level-shift current as a function of input common-mode voltage for the amplifier of FIG. 11.
Figure 18B:
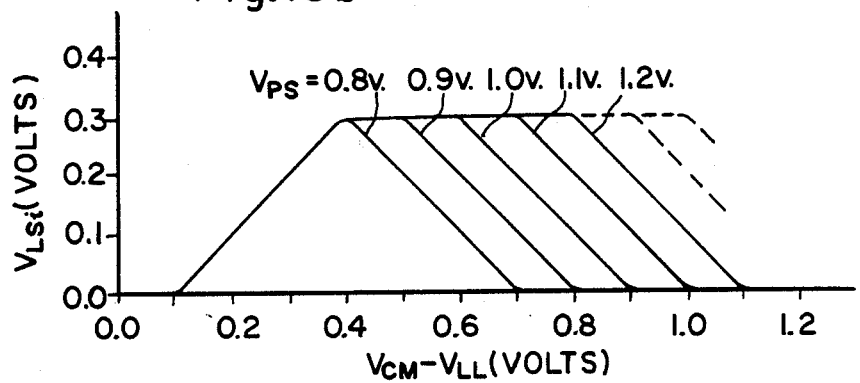
Figure 19:
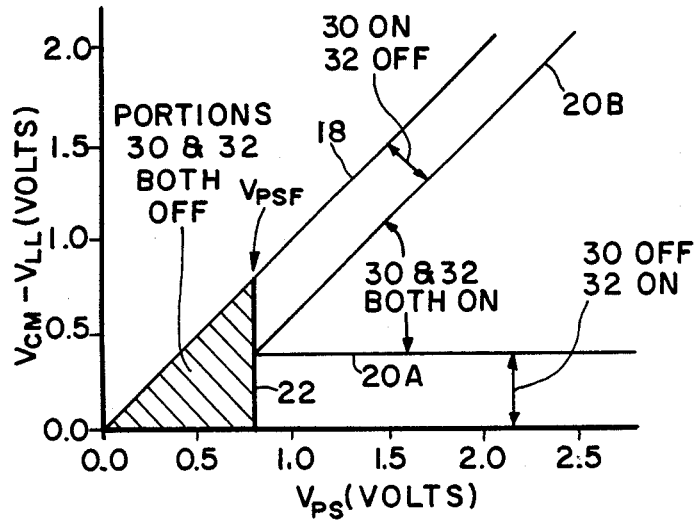
FIG. 19 is a graph illustrating the operational regions for the amplifier of FIG. 11 as embodied with the current supply of FIG. 4a for the level-shift variation indicated in FIGS. 18a and 18b.

As indicated above, the level-shift circuit normally shuts off when $V_{PS}$ rises. Nonetheless, there may be some applications in which the level-shift circuit should remain fully on as $V_{PS}$ is increased. FIGS. 18a and 18b indicate how level shift $V_{LSi}$ would vary with $V_{CM}$ in such an application for the case in which main supply 34 is implemented with the circuit of FIG. 4a. The basic variation at a 1.0-volt $V_{PS}$ is shown in FIG. 18a. FIG. 18b illustrates what happens as $V_{PS}$ is raised. FIG. 19 shows the resulting idealized operational regions.

In the embodiments of the invention variously illustrated in FIGS. 8-19, supply currents $I_{S1}$-$I_{S4}$ are all approximately equal. Consequently, portion 30 receives a level shift when portion 32 receives a level shift, and vice versa. The level shifts received by portions 30 and 32 are normally close to the same value.

Figure 20:
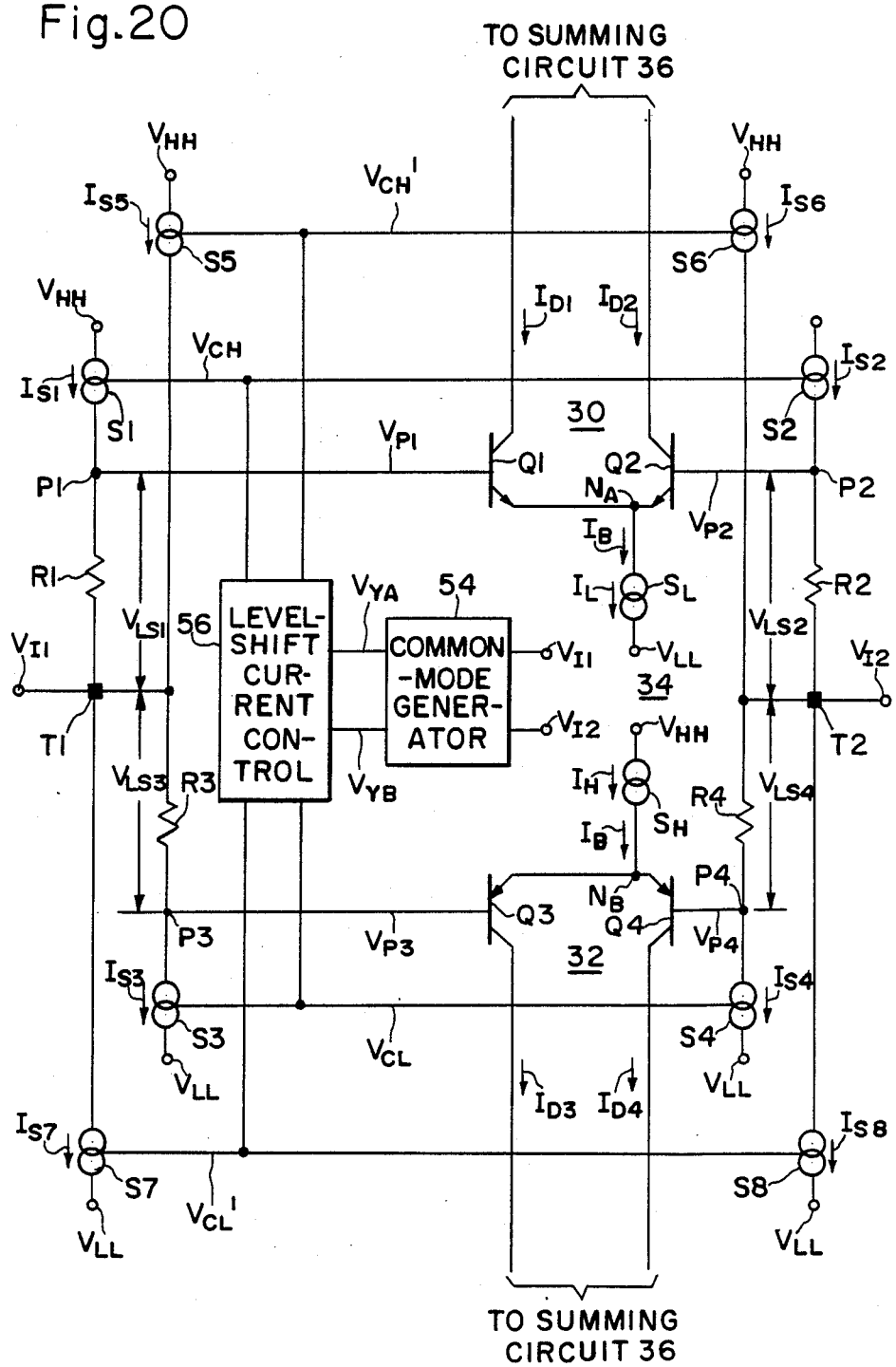
FIG. 20 is a block and circuit diagram of another general embodiment of FIG. 6.

FIG. 20 depicts an embodiment of FIG. 6 in which the level shifts supplied to portions 30 and 32 are largely independent of each other. This is achieved by using four additional variable current sources S5, S6, S7, and S8 arranged as indicated in FIG. 20. Sources S1, S2, S7, and S8 fix the level shift for portion 30. Sources S3-S6 similarly fix the level shift for portion 32.

In addition to control voltages $V_{CL}$ and $V_{CH}$, current control 56 in FIG. 20 supplies control voltages $V_{CL'}$ and $V_{CH'}$. Signals $V_{CH}$ and $V_{CL'}$ are generated at complementary values to control the level shift for portion 30. Signals $V_{CL}$ and $V_{CH'}$ are likewise supplied at complementary values to control the level shift for portion 32. However, signals $V_{CL}$ and $V_{CH'}$ do not necessarily track signals $V_{CH}$ and $V_{CL'}$.

while the invention has been described with reference to particular embodiments, this is solely for the purpose of illustration and is not to be construed as limiting the scope of the invention claimed below. For example, the level shifts might be implemented with Schottky diodes to improve the noise behavior. Thus, various modifications and applications may be made by those skilled in the art without departing from the true scope and spirit of the invention a defined in the appended claims.

We claim:

1. An electronic circuit, coupled between respective sources of a high supply voltage and a low supply voltage whose difference is a power supply voltage that defines a power supply range, for amplifying a circuit input signal differentially provided between first and second input terminals as respective first and second input voltages, the circuit comprising:

first differential means for amplifying the voltage difference between first and second input points respectively coupled to the first and second terminals to produce at least one amplified first internal signal, the first means being operatively conductive to so produce each first internal signal when the common-mode voltage $V_{CM}$ of the circuit input signal is in a portion of the supply range extending up to the high supply voltage;

second differential means for amplifying the voltage difference between third and fourth input points respectively coupled to the first and second terminals to produce at least one amplified second internal signal, the second means being operatively conductive to so produce each second internal signal when $V_{CM}$ is in a portion of the supply range extending down to the low supply voltage such that at least one of the differential means is operatively conductive as $V_{CM}$ traverses substantially the entire supply range when the power supply voltage is greater than or equal to a specified minimum level; and summing means for combining the internal signals to generate at least one circuit output signal; characterized by level-shift means comprising:

network means, coupled between the terminals and the points, for selectively causing the voltages at the first and second points to be respectively higher than the first and second input voltages by respective first and second voltage level shifts and for selectively lower than the first and second input voltages by respective third and fourth voltage level shifts; and level-shift supply means for providing current to the network means to control the values of the level shifts.

2. A circuit as in claim 1 characterized in that the network means comprises a first level-shift element coupled between the first terminal and the first point, a second level-shift element coupled between the second terminal and the second point, a third level-shift element coupled between the first terminal and the third point, and a fourth level-shift element coupled between the second terminal and the fourth point.

3. A circuit as in claim 2 characterized in that each level-shift element comprises a resistor.

4. A circuit as in claim 3 characterized in that the level-shift supply means comprises a first current source coupled between the first point and the high supply voltage source, a second current source coupled between the second point and the high supply voltage source, a third current source coupled between the third point and the low supply voltage source, a fourth current source coupled between the fourth point and the low supply voltage source, and control means for controlling conduction of the current sources.

5. A circuit as in claim 4 characterized in that each current source provides progressively less current as the power supply voltage rises so as to gradually turn off the level-shift means.

6. An electronic circuit for amplifying a circuit input signal differentially provided between first and second input terminals as respective first and second input voltages, the circuit comprising:

main supply means, coupled between respective sources of a high supply voltage $V_{HH}$ and a low supply voltage $V_{LL}$ whose difference is a power supply voltage $V_{PS}$ that defines a power supply range, for providing opposite first and second operating currents;

first differential means for amplifying the voltage difference between first and second input points by largely dividing the first operating current into a pair of amplified first internal signals, the first and second points being respectively coupled to the first and second terminals, the first means being operatively conductive to so produce the first internal signals when the common-mode voltage $V_{CM}$ of the circuit input signal is in a portion of the supply range extending up to $V_{HH}$;

second differential means for amplifying the voltage difference between third and fourth input points by largely dividing the second operating current into a pair of amplified second internal signals, the third and fourth points being respectively coupled to the first and second terminals, the second means being operatively conductive to so produce the second internal signals when $V_{CM}$ is in a portion of the supply range extending down to $V_{LL}$ such that at least one of the differential means is operatively conductive as $V_{CM}$ traverses substantially the entire supply range when $V_{PS}$ is greater than or equal to a specified minimum level; and summing means for combining the internal signals to generate at least one circuit output signal; characterized by level-shift means comprising:

network means, coupled between the terminals and the points, for selectively causing the voltages at the first and second points to be respectively higher than the first and second input voltages by respective first and second voltage level shifts and for selectively causing the voltages at the third and fourth points to be respectively lower than the first and second input voltages by respective third and fourth voltage level shifts; and level-shift supply means for providing current to the network means to control the values of the level shifts.

7. A circuit as in claim 6 characterized in that the level shifts are provided at values adequate to reduce the specified minimum level of $V_{PS}$ to a value below that which would occur if (a) the voltages at the first and third points were always substantially equal to the first input voltage and (b) the voltages at the second and fourth points were always substantially equal to the second input voltage.

8. A circuit as in claim 7 wherein: the first means is operatively conductive when the magnitude of the difference between $V_{LL}$ and the common-mode portion $V_{CMA}$ of the voltages at the first and second points is greater than or equal to a first threshold voltage $V_{TA}$ which can vary with $V_{PS}$; and the second means is operatively conductive when the magnitude of the difference between $V_{HH}$ and the common-mode portion $V_{CMB}$ of the voltages at the third and fourth points is greater than or equal to a second threshold voltage $V_{TB}$ which can vary with $V_{PS}$, characterized in that (a) the first and second level shifts are provided at values greater than or equal to $V_{TA} - V_{CM} + V_{LL}$ but less than $V_{HH} - V_{CM}$ and (b) the third and fourth level shifts are provided at values greater than or equal to $V_{TB} + V_{CM} - V_{HH}$ but less than $V_{CM} - V_{LL}$.

9. A circuit as in claim 8 wherein $V_{TA}$ and $V_{TB}$ have respective minimum values $V_{MA}$ and $V_{MB}$, characterized in that the value of the specified minimum level of $V_{PS}$ is less than $V_{MA} + V_{MB}$.

10. A circuit as in claim 9 characterized in that the value of the specified minimum level for $V_{PS}$ is greater than the larger of $V_{MA}$ and $V_{MB}$.

11. A circuit as in claim 8 characterized in that (a) the first and second level shifts are largely equal and (b) the third and fourth level shifts are largely equal.

12. A circuit as in claim 6 characterized in that the network means comprises a first level-shift element coupled between the first terminal and the first point, a second level-shift element coupled between the second terminal and the second point, a third level-shift element coupled between the first terminal and the third point, and a fourth level-shift element coupled between the second terminal and the fourth point.

13. A circuit as in claim 12 characterized in that each level-shift element comprises a resistor.

14. A circuit as in claim 12 characterized in that the level-shift supply means comprises a first current source coupled between the first point and the $V_{HH}$ source, a second current source coupled between the second point and the $V_{HH}$ source, a third current source coupled between the third point and the $V_{LL}$ source, a fourth current source coupled between the fourth point and the $V_{LL}$ source, and control means for controlling conduction of the current sources.

15. A circuit as in claim 14 characterized in that the level-shift supply means further includes a fifth current source coupled between the first terminal and the $V_{HH}$ source, a sixth current source coupled between the second terminal and the $V_{HH}$ source, a seventh current source coupled between the first terminal and the $V_{LL}$ source, and an eighth current source coupled between the second terminal and the $V_{LL}$ source.

16. A circuit as in claim 14 characterized in that the control means provides at least part of the current sources with a first control signal that, as a function of $V_{CM}$ when $V_{PS}$ is sufficiently low, gradually changes (a) from a first control level to a second control level in a first voltage transition zone referenced to $V_{HH}$ and (b) from the second control level back to the first control level in a second voltage transition zone referenced to $V_{LL}$.

17. A circuit as in claim 16 characterized in that the voltage transition zones meet each other.

18. A circuit as in claim 17 characterized in that the voltage transition zones shrink in size as $V_{PS}$ increases so that the difference between the two control levels decreases.

19. A circuit as in claim 16 characterized in that the control means (a) supplies the first control signal to the first and second current sources, (b) generates a second control signal having largely the oppOsite variation as the first control signal, and (c) supplies the second control signal to the third and fourth current sources.

20. A circuit as in claim 16 characterized in that the control means comprises:

generating means responsive to the input voltages for producing first and second operating voltages that bear specific relationships to $V_{CM}$;

first reference means for supplying a first reference voltage that is referenced to $V_{LL}$ at least when $V_{PS}$ is sufficiently small;

second reference means for supplying a second reference voltage that is referenced to $V_{HH}$ at least when $V_{PS}$ is sufficiently small; and linear means responsive to the operating voltages and the reference voltages for producing the first control signal.

21. A circuit as in claim 20 characterized in that the linear means comprises:
    a first amplifying section for amplifying the difference between the first operating voltage and the first reference voltage to produce a first amplified voltage;
    a second amplifying section for amplifying the difference between the second operating voltage and the second reference voltage to produce a second amplified voltage; and
    AND/NAND means for generating the first control signal largely as either the linear AND of the amplified voltages or the linear NAND of the amplified voltages.

22. A circuit as in claim 20 characterized in that the linear means comprises:
    a first amplifying section for amplifying the difference between the first operating voltage and the first reference voltage to produce a first amplified voltage; and
    a second amplifying section having a gain control terminal responsive to the first amplified voltage for amplifying the difference between the second operating voltage and the second reference voltage to produce the first control signal.

23. A circuit as in claim 20 characterized in that the generating means comprises the level shift elements, both differential means, and the main supply means.

24. A circuit as in claim 23 characterized in that the first and second operating voltages are largely the voltages at which the first and second operating currents are respectively supplied.

25. A circuit as in claim 6 wherein: the first internal signals are differentially representative of the circuit input signal when the first differential means is operatively conductive; and the second internal signals are differentially representative of the circuit input signal when the second differential means is operatively conductive.

26. A circuit as in claim 6 wherein each differential means comprises a pair of like-configured amplifiers, each amplifier having a first flow electrode, a second flow electrode, and a control electrode for regulating current transmission between the flow electrodes, the amplifiers in the first means having (a) their control electrodes respectively coupled to the first and second points, (b) their first electrodes coupled together to receive the first operating current, and (c) their second electrodes respectively coupled to the summing means to supply the first internal currents, the amplifiers in the second means having (a) their control electrodes respectively coupled to the third and fourth points, (b) their first electrodes coupled together to receive the second operating current, and (c) their second electrodes coupled to the summing means to supply the second internal currents, the amplifiers in the second means being complementary to the amplifiers in the first means.

27. A circuit as in claim 26 characterized in that charge carriers that move between the flow electrodes of each amplifier originate at its first electrode and terminate at its second electrode.

28. A circuit as in claim 27 wherein each amplifier is a bipolar transistor having an emitter, a collector, and a base respectively coupled to the first, second, and control electrodes of that amplifier.

* * * * *